United States Patent [19]

Sade et al.

[11] 4,202,482

[45] May 13, 1980

[54] SOLENOID ACTUATED WIRE FEED AND TEARING APPARATUS

[75] Inventors: Moshe E. Sade, Horsham; Albert Soffa, Wynnewood; Dan Vilenski, Hatboro; William Wing, Horsham, all of Pa.

[73] Assignee: Kulicke & Soffa Industries, Inc., Horsham, Pa.

[21] Appl. No.: 963,163

[22] Filed: Nov. 22, 1978

[51] Int. Cl.$^2$ ............................................. B23K 19/04
[52] U.S. Cl. ...................................... 228/4.5; 228/1 R; 228/13; 228/904; 225/105; 226/160; 226/162; 226/163; 219/56.1
[58] Field of Search .................. 228/4.5, 1 R, 13, 110, 228/904, 44.1 R, 44.1 A; 219/56.1, 56.21, 85 F; 225/105; 226/158, 160, 162, 163

[56] References Cited

U.S. PATENT DOCUMENTS

| | | | |
|---|---|---|---|
| 3,543,988 | 12/1970 | Kulick, Jr. | 228/1 R |
| 3,863,827 | 2/1975 | Foulke et al. | 228/4.5 |
| 3,954,217 | 5/1976 | Smith | 228/1 R |

Primary Examiner—Daniel C. Crane

[57] ABSTRACT

A bonding head of the type having a bonding tool mounted in the bonding tool holder is provided with a pivotable wire clamp which is movable toward and away from the rear of the bonding tool. The wire clamp is pivotally movable to three distinct positions by a single solenoid. The wire clamp is opened and closed by a second solenoid. The solenoids are mounted on the pivot axis of the bonding tool holder in a manner which substantially prevents the shock force of actuation of the solenoid from being imparted into the bonding tool holder or the bonding tool during a bonding operation.

12 Claims, 12 Drawing Figures

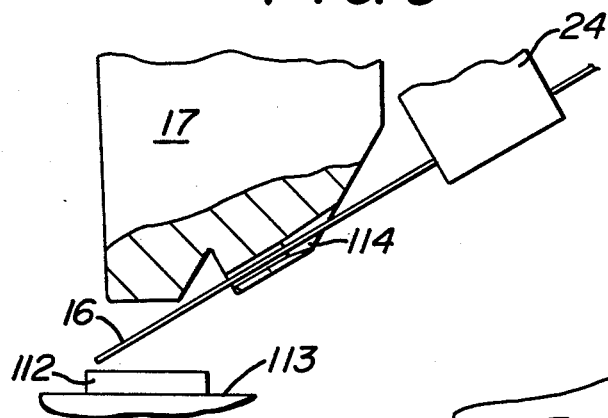
FIG. 8
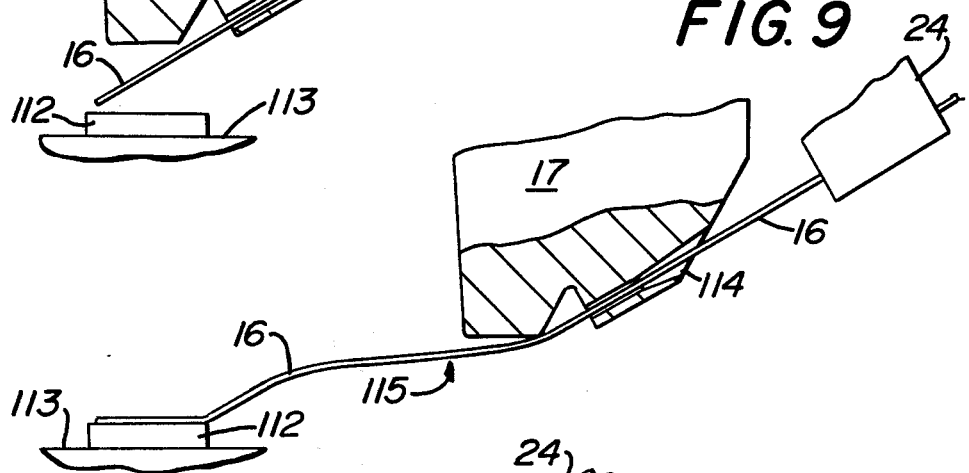
FIG. 9
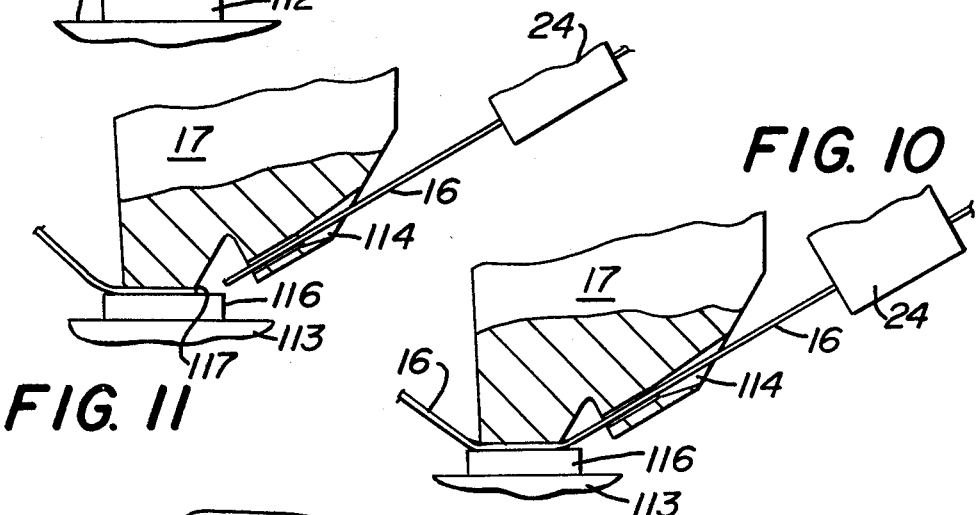
FIG. 10
FIG. 11
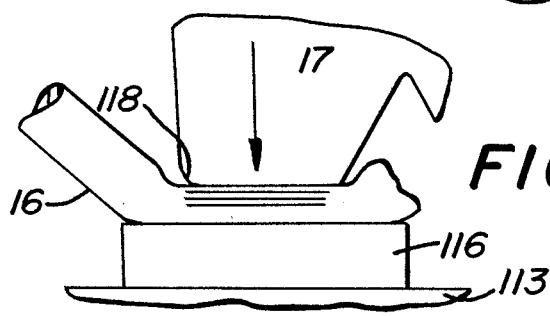
FIG. 12

SOLENOID ACTUATED WIRE FEED AND TEARING APPARATUS

BACKGROUND OF THE INVENTION

1. Field of the Invention

The present invention relates to fine wire bonders and more specifically to the apparatus for feeding and tearing fine wires being bonded by a wedge bonding tool of a very high speed automatic wedge wire bonder.

2. Description of the Prior Art

Wedge bonders are known in the prior art. Modern wedge bonders are provided with wire clamps which clamp and pull on the wire to tear or break the wire behind the second or last wire bond while the bonding tool is held on the bond position. After the wire is broken behind the foot of the wedge bonding tool, the bonding tool may be raised away from the work piece and the wire clamp is moved forward to push or feed a length of wire under the working face of the wedge bonding tool. Thus, the wedge bonding tool apparatus is prepared for a new first bond.

Various types of actuators have been employed to open and close prior art wire clamps and to move the wire clamps relative to the wedge bonding tool. Manually operated wedge wire bonders have heretofore employed cams which actuate wire clamps to feed and to tear the wires being bonded by a wedge bonding tool. Our U.S. Pat. No. 3,543,988 issued Dec. 1, 1970 shows and describes a high speed ultrasonic tailless wedge wire bonder identified as Kulicke & Soffa Model 484. The main cam bank of this wedge bonder was provided with cams which actuated cam followers on levers which actuated push pins which in turn actuated the wire clamp of the tailless wedge bonder. The push pins in this device were extended through hollow transducer pivot screws. Cams of the type described in the aforementioned patent are actuated by motors which complete a single machine cycle in slightly under 1 second. The actuating cams are capable of imparting sufficient force to the moving mechanism to drive or move parts having large masses. Further, the profiles on the drive cams are arranged such that little or no shock or vibration motion is imparted to the bonding head or the wire bonding tool.

Automatic wedge wire bonders which employ servomotor drives are capable of completing a machine cycle two or three times faster than the prior art cam driven wedge wire bonders. It was discovered that high speed means were required to actuate the wire clamp formerly actuated by cams. Attempts to substitute heavy solenoids in place of cams was not possible because the high speed automatic wire bonder required that the bonding head be rotatable. Attempts to mount light weight high energy solenoids on the bonding tool holder for energizing and actuating the wire clamp created undesirable shock and vibrations. High speed solenoids are actuated in only several milliseconds which creats a large shock force.

It was found that the actuation of high speed solenoids generated an action and reaction inertia effect on the bonding tool holder. When the solenoid plunger of the high energy solenoid reached its limit of travel, the mass of the plunger would suddenly stop and created a second and larger shock effect on the bonding tool holder. Efforts to mount the solenoids near the wire clamp created shock forces which added to the bonding tool force and created vibrations whose settling time extends up to and includes 70 milliseconds. It was found that high speed solenoids when attached to any part of a rotatable wedge bonding head generates some inertia and shock force when actuated. These forces are transmitted throughout the bonding head which supports the bonding tool. Since the bonding tool of a automatic high speed wedge bonder is preferably an ultrasonic transducer the horn or bonding tool holder of the transducer is shaped liked a tapered cantilever beam. Any high impact shock force which creates an undamped vibration having harmonic frequencies will impart ringing to the transducer. If the solenoid is mounted on the bonding head housing or the bonding tool mounting block in a manner which allows the inertia and shock forces to generate a moment force around the bonding tool, some of the moment force is imparted to the working face of the bonding tool so as to change or modify the bonding force applied during a bonding operation.

It was discovered that high speed solenoids which are adapted to operate in under 5 milliseconds are capable of producing ringing vibrations which continue for up to 70 milliseconds. Such vibrations require that the bonding tool be held steady until the vibrations stop to prevent improper bonds. Thus, much of the time saved by employing fast high energy solenoids may be lost due to the aforementioned vibrations.

The greater problem arises when the inertia or impact force of the solenoid applies an appreciable bonding force to the bonding tool during a bonding operation. If the additive forces are high enough they can cause the wire at the bond to be mashed flat. Over squashed or mashed flat bonds are weakened by the reduction in the cross-section of the wire extending from the bond. Such bonds are not acceptable on most devices that are sold commercially. It is not economical to attempt to remove the oversquashed bonds and to rework the semiconductor device. Further, it is not desirable to have to pull test the bonds to determine if they have been oversquashed and been reduced in strength. Semiconductor devices having bonds of widely varying bonding strength are not saleable as commercial products.

It is a primary object of the present invention to provide a high speed solenoid actuated wire feed and tearing apparatus.

It is another object of the present invention to provide a low mass, high speed solenoid for actuating wire clamps employed on rotatable bonding head high speed automatic wedge wire bonders.

It is another object of the present invention to provide a novel solenoid actuated mechanism for positioning a wire clamp in three distinct positions employing a single high speed solenoid.

It is another object of the present invention to provide a novel bonding head having a unique housing and bonding tool mounting block structure for supporting a pair of high speed solenoids.

It is a general object of the present invention to provide a light weight bonding head having a low mass housing and transducer mounting block capable of supporting high speed solenoids without creating ringing in a bonding tool transducer when the solenoids are actuated.

It is a further object of the present invention to provide a novel pivotable transducer mounting block for supporting a wire clamp of a high speed automatic wedge bonder.

According to these and other objects to be discussed hereinafter, there is provided a rotatable bonding head having a housing comprising two parallel and depending arms. Each of the depending arms is provided with a hollow cylindrical transducer pivot screw which extend through the depending arms and are actually aligned so as to pivotally support a transducer mounting block. Solenoid actuated push pins extend through the center of the hollow cylindrical transducer pivot screws and are adapted to actuate levers for articulating the wire clamp and for opening and closing the wire clamp to feed and tear a fine wire being bonded by a wedge bonding tool. The solenoids are mounted on the housing of the bonding head and the actuating levers are mounted on the transducer mounting block so that the inertia and impact forces created by actuation of the high speed solenoids are imparted into the rigid housing having a high mass so as to damp the impact vibrations before they are imparted to the actuating levers and the transducer mounting blocks so as to impart vibration of forces to the bonding tool.

BRIEF DESCRIPTION OF THE DRAWINGS

FIG. 8 is an enlarged partial section in elevation showing an ultrasonic wedge bonding tool and its associated wire clamp in a forward feed and close position prior to a first bond;

FIG. 9 is an enlarged partial section of the bonding tool of FIG. 8 after first bond showing the wire clamp in the normal or middle position prior to being closed;

FIG. 10 is a partial section in elevation showing the bonding tool of FIGS. 8 and 9 as it would appear during the second or last bond position wherein the wire clamp is closed in the middle position;

FIG. 11 is an enlarged partial elevation of the bonding tool in FIGS. 8-10 in the second bond position wherein the wire clamp is in the rear and closed tear position; and FIG. 12 is an enlarged elevation in partial section exaggerated to show how the working face of the bonding tool squashes and holds the wire being bonded at second bond.

DESCRIPTION OF THE PREFERRED EMBODIMENT

Figure 1:
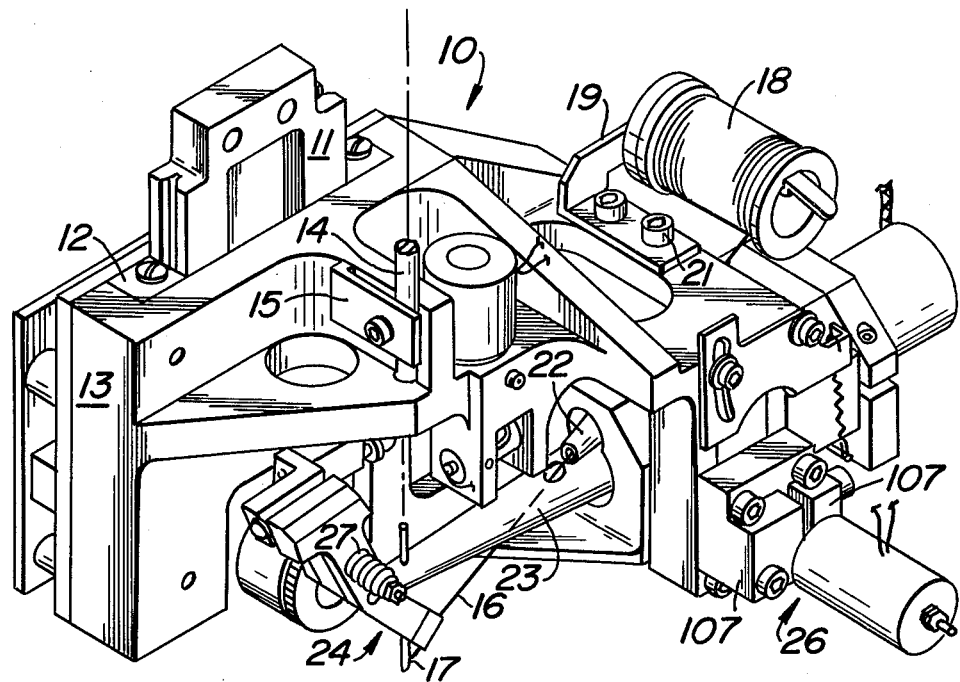
FIG. 1 is a front and side isometric view showing the bonding head mechanism mounted on a vertical slide.
Figure 3:
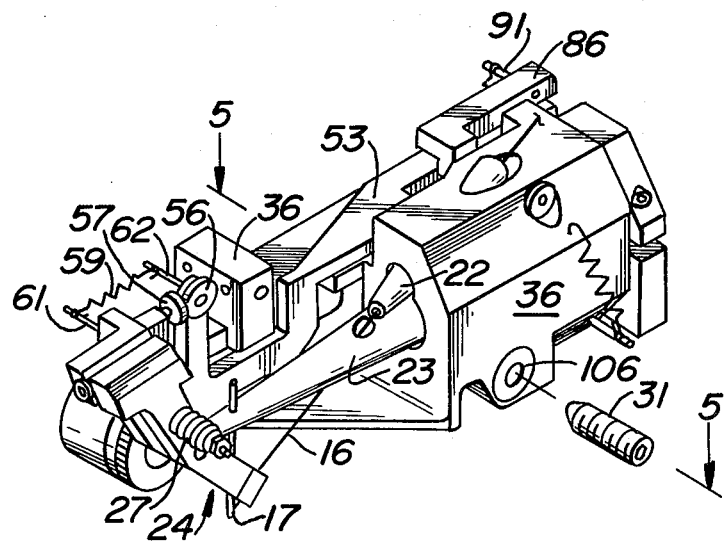
FIG. 3 is a front and side isometric view showing the transducer mounting block and the actuating levers for rocking the wire clamp.
Figure 2:
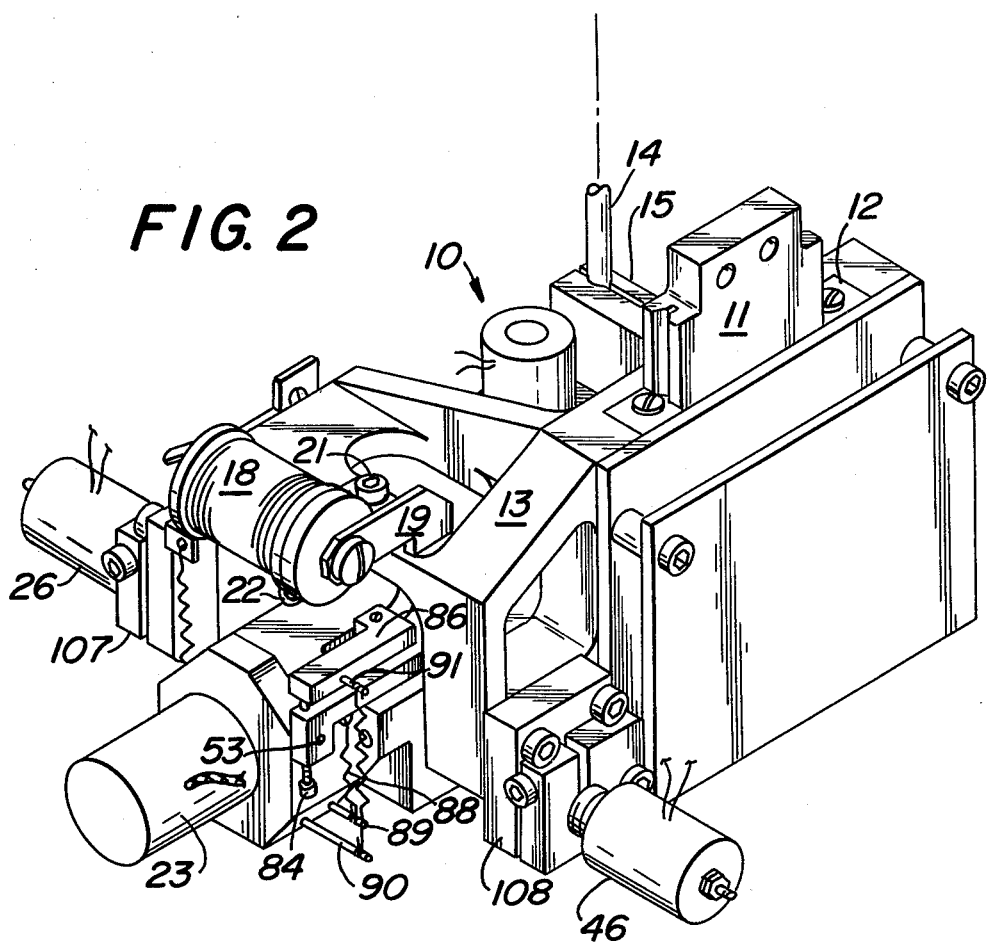
FIG. 2 is a rear and side isometric view of the bonding head mechanism showing the wire feed clamp solenoid and wire clamp actuating solenoid.

Referring now to FIGS. 1-3 showing isometric view of the bonding head 10 mounted on slide 11. It will be understood that the slide 11 is mounted on means for rotating the bonding head 10 (not shown) and need not be described herein to describe the present invention. Slide 11 is mounted in a bearing slider 12 forming a part of housing 13. Housing 13 is vertically movable by Z-motion drive rod 14 held by clamp 15 against housing 13. The wire 16 to be bonded by the bonding tool 17 is supplied by spool 18 which is rotatably mounted on spool bracket 19 mounted on housing 13 by screws 21. The wire 16 is fed from the spool 18 through a guide funnel 22 and extends through the ultrasonic transducer 23 where it is threaded into the guide openings in the wedge bonding tool 17.

Bonding tool 17 is adapted to complete a first bond of a wire 16 on a pad or electrode of a semiconductor device (not shown) and the bonding tool 17 is then moved relative to the semiconductor device playing out a portion of the wire 16 in the form of a loop. The bonding tool 17 is adapted to then complete a second or last bond on a pad or lead out connection. While the bonding tool is on the second bond the wire clamp 24 is adapted to break the wire at the rear of the bonding tool 17. Then the bonding tool 17 is raised to permit the wire to be fed under the working face of the bonding tool 17 as will be described in detail hereinafter. To control the wire 16 relative to the working face of the bonding tool, it is necessary to be able to selectively open and close the wire clamp 24 and to rock the wire clamp 15 to three distinct positions.

Figure 4:
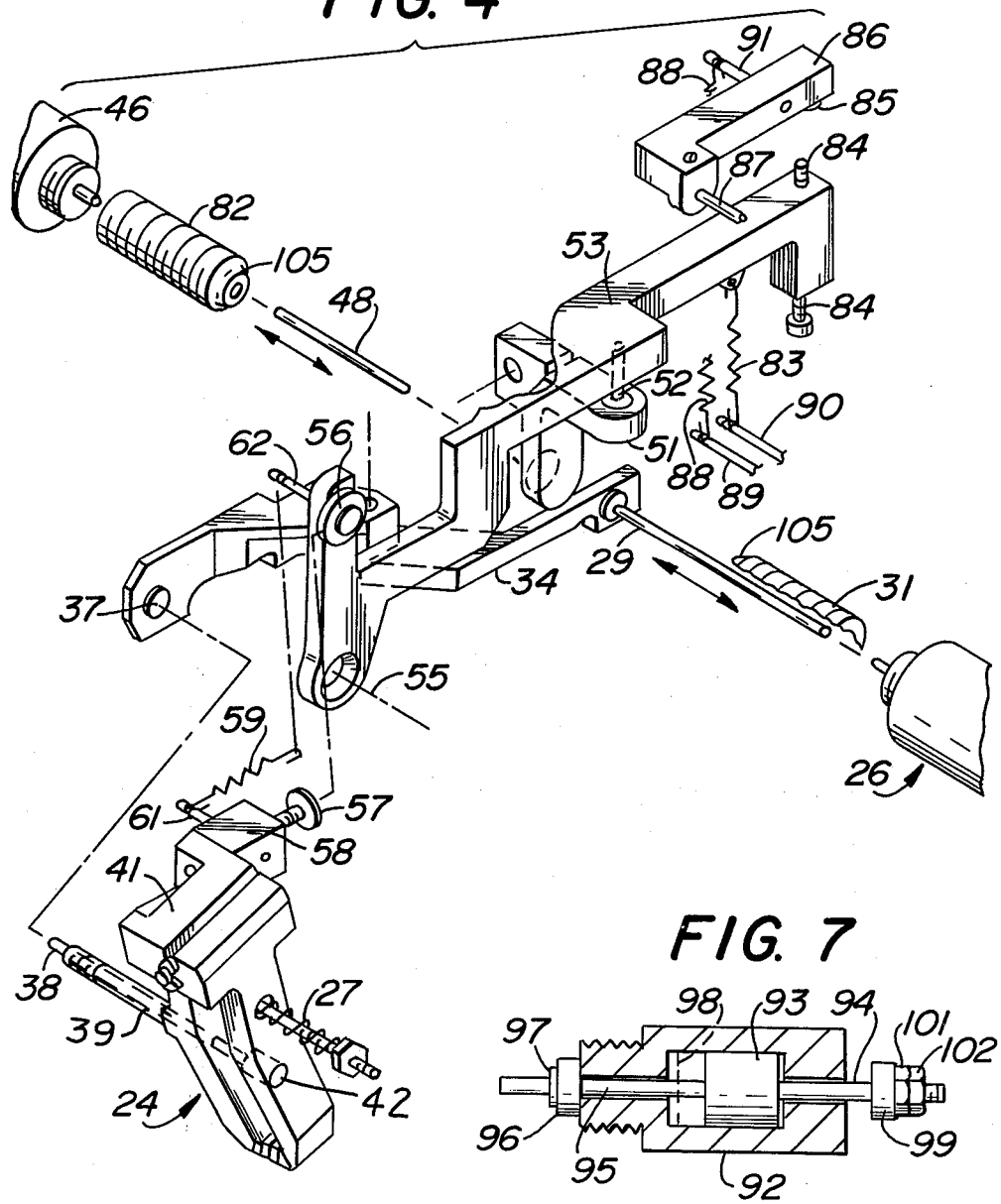
FIG. 4 is an exploded isometric view of the actuating levers and the wire clamp shown in FIG. 3.
Figure 5:
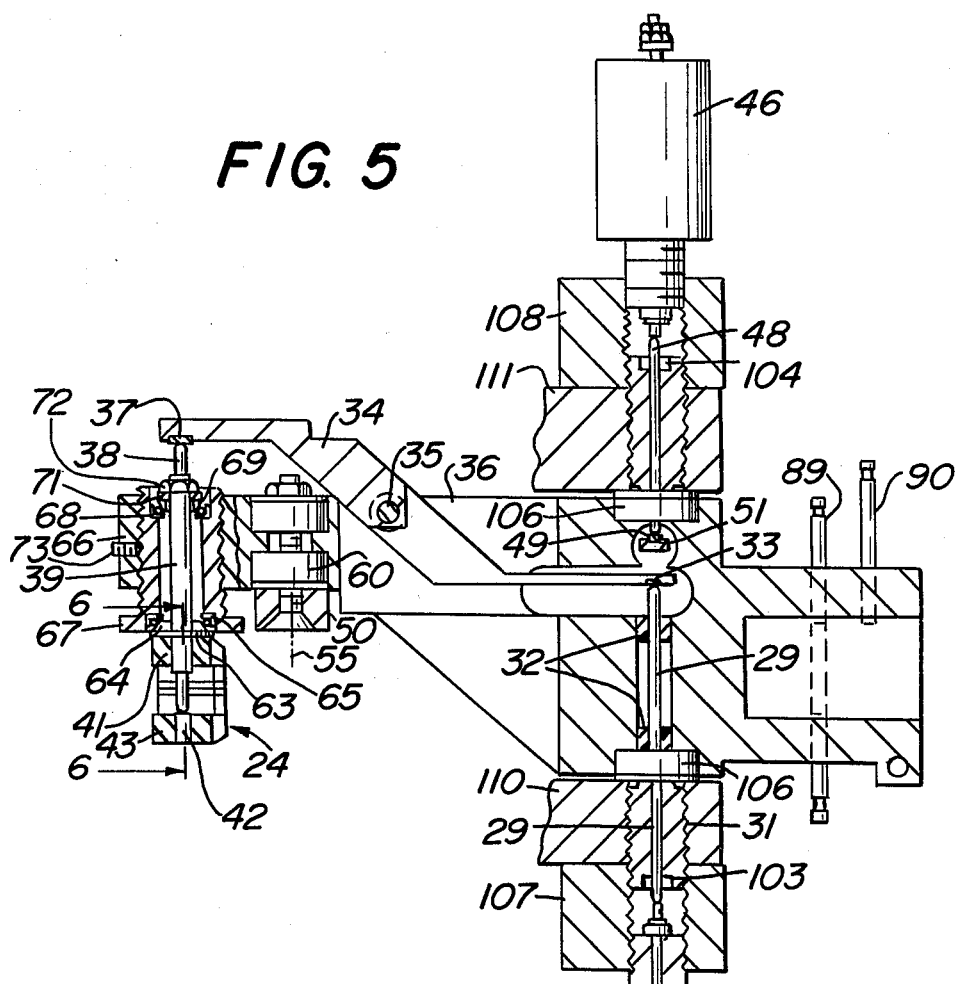
FIG. 5 is an enlarged section in plan view taken at lines 5—5 of FIG. 3.

As best shown in FIGS. 3-5, wire feed clamp solenoid 26 is adapted to open and close wire clamp 24. Wire clamp 24 is normally urged to a closed position by clamp force spring 27 and is only opened when wire feed clamp solenoid 26 is actuated. As best shown in FIG. 5 when solenoid 26 is actuated its plunger 28 is moved inward toward the transducer 23 so that the flat outer end of the plunger engages the domed end of push rod 29 which is guided in a hollow transducer pivot screw 31 and bearings 32. The other domed end of push rod 29 engages a recessed sapphire disc 33 in clamp opening and closing lever 34 which is pivotally mounted at pivot 35 extending from transducer mounting block 36. The lever arm of lever 34 is provided with a sapphire disc 37 which is engageable with push rod 38. Push rod 38 extends through hollow shaft 39 which is press fitted into left jaw 41 of wire clamp 24. The domed end of push rod 38 is engageable with flat nose set screw 42 screwed in threads of right jaw 43. Thus, actuation of solenoid 26 causes push rod 38 to pivot right jaw 43 on jaw pivot shaft 44 to open wire clamp 24 which was biased closed by clamp force spring 27.

Wire feed solenoid 46 is normally deenergized and the wire clamp 24 is in its forwardmost position adjacent bonding tool 17 in the normally closed position. When the plunger 47 of solenoid 46 is actuated, it moves toward transducer 23. As will be explained, plunger 47 has two distinct degrees of movement for moving crowned domed push rod 48 in engagement with disc shaped sapphire 49 inserted in bell crank 51 which is pivotally mounted on a pivot pin (not shown) on transducer mounting block 36. As best shown in FIG. 4, counterclockwise rotation of bell crank lever 51 causes engagement of the lever 51 with domed push rod 52 mounted in clamp tear-feed lever 53. Clamp tear-feed lever 53 is rocked counterclockwise as shown in FIG. 4 about the axis 55 of a pivot pin 50 mounted in no loss motion bearings 60 in transducer mounting block 36. Counterclockwise rotation of lever 53 pivots roller 56. Roller 56 is engaged with the jewel (not shown) inserted in the head of zero adjusting screw 57 threaded into the extension 58 of the left jaw 41. Roller 56 and zero adjusting screw 57 are normally biased in engagement by a spring 59 connected on hangars 61 and 62 on jaw 41 and lever 53 respectively. Rocking motion imparted to jaw 41 through extension 58 causes wire clamp 24 to pivot on hollow shaft 39. As best shown in FIG. 5, hollow shaft 39 is press fitted into jaw 41 at shoulder 63. Shoulder 63 supports inner race 64 which cooperates with the bearings of the outer race shown as an angular bearing 65 fitted in threaded cylindrical sleeve 66 which is provided with a knurled adjustment wheel 67. The sleeve 66 is further provided with an angular contact bearing 68 which cooperates with an inner race 69 supported in place by tension washer 71 and tension nut 72 threaded on hollow shaft 39. Wire clamp 24 may be adjusted in and out by rotating knurl adjustment wheel 67 which is locked in place by set screw 73.

Figure 6:
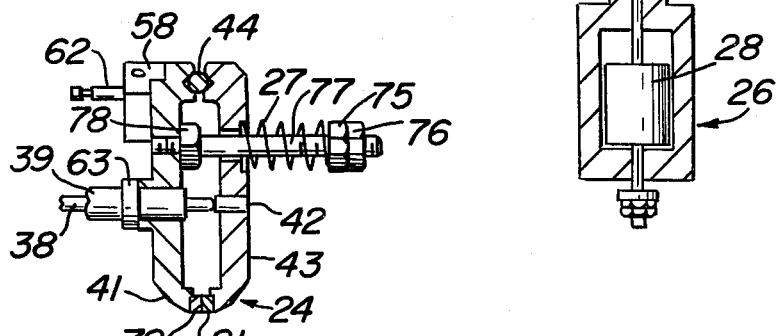
FIG. 6 is an enlarged section in elevation taken through lines 6—6 of FIG. 5.

As best shown in FIG. 6, clamp 24 is normally closed by clamp force spring 27 which is engaged between the right jaw 43 and adjusting nut and lock nuts 75 and 76 threaded on shaft 77 which is screw mounted in left jaw 41 and locked in place by lock nut 78. Jaws 41 and 43 are provided with sapphire jaw inserts 79 and 81. Clamp force spring 27 is adjusted to approximately 150 grams clamping force which is distributed over a length of wire sufficient to prevent mashing the wire, but of sufficient force to enable the wire to be clamped and broken during the bonding operation.

As best shown in FIGS. 4 and 5, wire feed solenoid 46 engages domed push rod 48, slideably mounted in hollow transducer pivot screw 82, to engage bell crank lever 51. Bell crank lever 51 is engageable with domed push rod 52 mounted in lever 53 which imparts counterclockwise motion thereto. Feed force spring 83 is connected between clamp tear-feed lever 53 and hanger 90 to impart a clockwise spring bias force to lever 53. When solenoid 46 is energized to a first distinct current level, the bias of feed force spring 83 is overcome permitting lever 53 to rotate on axis 55 so as to engage wire feed adjusting screw 84 with a sapphire disc 85 mounted in tear force lever 86. Tear force lever 86 is pivotally mounted on transducer mounting block 36 via pivot pin 87 fixed in lever 86. Tear-force lever 86 is biased in a clockwise direction by tear-force spring 88 connected between hanger 89 in mounting block 36 and hanger 91 pressed into lever 86. It will be understood that the first distinct current level applied to solenoid 46 is only sufficient to overcome the bias of feed force spring 83 and insufficient to overcome the bias of tear-force spring 88 so that the first degree of movement of clamp tear-feed lever 53 is only sufficient to move clamp 24 from its forward or feed position to a normal or intermediate position. When a second distinct current level is applied to solenoid 46, it is sufficient to overcome the bias of tear force spring 88 and to further rotate lever 53 counterclockwise until tear feed solenoid completes its stroke against its damper washer.

When the wire clamp 24 is closest to the bonding tool 17, it is in its normal or feed position. When the wire clamp is rocked to its intermediate position and closed it is in a position prepared to tear or break the wire from the second or last bond made by the bonding tool. When the wire clamp 24 is rotated to its position furtherest from the bonding tool, it is in the position where it has torn the wire from the bond under the bonding tool. When the wire clamp 24 is in its rearmost position with the jaws closed upon the broken wire it is prepared to be rocked forward to its forwardmost position so as to feed the wire under the working face of the bonding tool 17 for the next bonding operation as will be explained hereinafter in detail.

Figure 7:
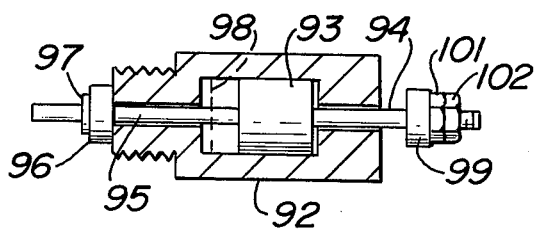
FIG. 7 is an enlarged section taken through one of the high energy solenoids.

Refer now to FIG. 7 showing a detailed in cross-section of the solenoids employed with the present invention. The housing 92 of the solenoid is provided with an electrical coil (not shown). The plunger 93 is preferably a cylinder of high silicon steel connected to actuating rods 94 and 95. The plunger cylinder is shown in its normal deenergized position wherein plastic washer 96 held by retaining ring 97 in a groove of actuating rod 95 is engaged with the left end of housing 92 as shown in FIG. 7. When the coil of the solenoid is energized, the plunger 93 moves to the left causing the cylindrical plunger to move to a position shown by dotted line 98. The leftmost extension position is limited by nylon damper washer 99 held in position by nut 101 and lock nut 102 threaded on the actuation rod 94. The maximum impact force is created if the plunger is permitted to engage the housing 92. Accordingly, the damper washer 99 will reduce substantially the impact force. In similar manner, plastic washer 96 will reduce the impact force when the flat nosed actuating rod 95 is returned to its normal position by the spring attached to the actuating levers and wire clamp jaws as described hereinbefore. In the preferred embodiment, a small amount of slack is provided in the actuating system between actuating rod 94 of solenoid 26 and the flat nose adjusting set screw 42 in jaw 43 of wire clamp 24. All of the slack may be taken out of the actuating system of solenoid 46 which provides the rocking motion of clamp 24 because there is a zero adjusting screw 57 provided in the linkage system for precise location of the wire clamp 24 relative to the bonding tool 17.

It will be noted that solenoids 26 and 46 are provided with actuating rods 95 which engage push rods 29 and 48 respectively which are slideably mounted in hollow transducer pivot screws 31 and 82 respectively. The pivot screws 31 and 82 are provided with allen head recesses 103 for adjusting the pivot pressure on the pivot cones 105 which engage the mating cones of bearing boxes 106 press fitted in mounting block 36. Split clamps 107 and 108 are attached to housing 13 and provide means for locking and securing the solenoids 26 and 46 after they are screw adjusted in the split clamps 107 and 108 respectively.

It will be noted that the separate split clamps 107 and 108 may be mounted on the housing 13 with isolation blocks (not shown) and that the nature of the split clamps themselves provides some damping effect. Since solenoids 26 and 46 are axially aligned on the pivot axis of mounting block 36, the impact force of the solenoids is transferred from the solenoid housing 92 to the split clamps 107 and 108 and then into the depending arms 110 and 111 of the housing 13 which has substantial mass. Further, any impact shock in the axial direction cannot create a moment force which is transmitted through the transducer 23 to the working face of the bonding tool 17. Since the solenoids 26 and 46 are mounted through the pivot axis of the transducer mounting block 36 where the mass of the bonding head is the greatest the maximum amount of damping is accomplished. The settling time of the vibrations induced into the bonding head have been reduced from approximately 70 milliseconds down to 5 milliseconds which is the approximate actuation time of the high speed solenoids.

Refer now to FIGS. 8 through 12 showing in enlarged sections, the working face of the bonding tool 17 and its position relative to the wire clamp 24. FIG. 8 shows the bonding wedge 17 as it would appear over a bonding pad 112 of a semiconductor device 113 prior to a first bond operation. The wire 16 has been fed by the wire clamp 24 through the funnel 114 and the wire clamp is in its forwardmost and closed position. After the first bond operation as shown in FIG. 9 the ultrasonic bonding wedge 17 is raised and moved so as to create a loop 115 as the wire is played out through the funnel 114. During this play out operation the wire clamp 24 has been opened and has been moved to the intermediate or mid position. As the ultrasonic bonding wedge 17 is moved down to the second bond position as shown in FIG. 10, the wire clamp 24 is closed in the mid position and is held closed during the second or last bond operation which is performed on another pad 116 which may be on the same semiconductor device or at a lead out terminal. After completion of the second bond operation, the bonding tool 17 is held down with sufficient bonding force to prevent damage to the bond as the wire 16 is now pulled by the closed wire clamp from its mid closed position to its rearmost closed position as shown in FIG. 11. Moving the wire clamp 24 from its mid close position to its rearmost closed position causes the wire 16 to tear or break under the heel 117 of the working face of the bonding tool 17 as best shown in FIGS. 11 and 12. After the wire 16 is broken from the second bond, the bonding tool is raised and the closed wire clamp is returned to a forwardmost and closed position as shown in FIG. 8 to feed a length of wire under the working face of the bonding tool 17 in preparation for the next first bond. FIG. 12 is a greatly enlarged partial section of the bonding tool 17 and wire 16 to illustrate the manner in which the wire 16 is squashed during a proper bonding operation. Had the impact force of the operation of the solenoids created an additional bonding force while the bonding tool was performing the bonding operation, the wire 16 could have been mashed a greater amount which would have diminished the cross-section of the connecting wire 16 at the toe 118 of the working face of the bonding tool 17. A decrease of the cross-sectional area will make the bond so weak that a slight amount of jar or force applied to the connecting wire may be sufficient to cause the wire to break and the semiconductor device would be inoperable until it was repaired. Repair or rework of improper connecting wires on very small intergrated circuits is not commercial feasible. Such rework is near impossible and sometimes destroys the semiconductor device during the repair operation.

We claim:

1. A solenoid actuated wire clamping apparatus for feeding a fine wire to a bonding tool and tearing the fine wire after being bonded by the bonding tool of the type employed with wedge bonding machines, comprising:
    (a) a bonding head housing having two depending support arms,
    (b) a bonding tool holder mounting block pivotally mounted between said arms of said housing,
    (c) a pair of axially aligned hollow transducer pivot screws extending through said arms of said housing for pivotally supporting said mounting block,
    (d) an actuating rod extending through each said hollow pivot screw,
    (e) first and second solenoids mounted outboard on said housing,
    (f) each said solenoid being adapted to engage one of said actuating rods,
    (g) a wire clamp pivotally mounted on said bonding tool holder mounting block,
    (h) a bonding tool holder having a bonding tool mounted therein rigidly mounted in said bonding tool holder mounting block for positioning said bonding tool in front of said wire clamp,
    (i) first lever means mounted on said bonding tool holder mounting block for movement by said first solenoid through an actuating rod for articulating said wire clamp to a plurality of predetermined positions, and
    (j) second lever means mounted on said bonding tool holder mounting block for movement by said second solenoid through an actuating rod for opening and closing said wire clamp whereby, said wire clamp may be actuated by said solenoids with a minimum of impact and shock force imparted to the working face of the bonding tool.

2. A solenoid actuated wire clamping apparatus as set forth in claim 1 wherein said wire clamp is pivotable to three distinct predetermined positions by said first solenoid.

3. A solenoid actuated wire clamping apparatus as set forth in claim 2 wherein said first solenoid having a solenoid plunger is actuatable by three distinct current levels,
    a zero current level being representative of no movement of the solenoid plunger,
    a second current level which is representative of a partial rocking movement of said wire clamp, and
    a third current level which is representative of a maximum rocking movement of said wire clamp.

4. A solenoid actuated wire clamping apparatus as set forth in claim 3 wherein said first lever means comprises a first spring bias lever pivotally mounted on said mounting block to normally force said actuating rod against the plunger of said first solenoid when there is no movement of said solenoid plunger and said wire clamp is in the forwardmost position adjacent said bonding tool.

5. A solenoid actuated wire clamping apparatus as set forth in claim 4 wherein said first lever means further comprises a second spring bias lever pivotally mounted on said mounting block to normally engage a stop pin and to restrain said first spring bias lever after it has been moved by partial movement of said solenoid plunger and wherein said wire clamp is positioned in an intermediate feed position.

6. A solenoid actuated wire clamping apparatus as set forth in claim 5 wherein said second spring bias lever is movable from its normal spring bias position to its stop position by said first spring bias lever after it has been moved by said solenoid plunger moving to its third distinct current level representative of maximum movement of said solenoid plunger and wherein said wire clamp is positioned in its rearmost tearing position.

7. A solenoid actuating wire clamping apparatus as set forth in claim 6 wherein said first solenoid is fully actuated with its highest current level when said wire clamp is positioned in its rear tearing position.

8. A solenoid actuated wire clamping apparatus as set forth in claim 1 wherein said first lever means comprises a plurality of levers pivotally mounted on said bonding tool holder mounting block,
    one of said levers being formed as a spring bias bell crank lever,
    said wire clamp being provided with a lever arm engaging said bell crank lever, and spring means normally engaging said wire clamp lever arm with said bell crank lever so that said wire clamp is positionable by said spring bias bell crank lever.

9. A solenoid actuated wire clamping apparatus as set forth in claim 1 wherein said first and said second solenoids each solenoid having a plunger are mounted on said housing with the axis of their plunger substantially parallel to the axis of said hollow cylindrical transducer pivot screws.

10. A solenoid actuated wire clamping apparatus as set forth in claim 1 wherein said first and said second solenoids are mounted in axial alignment with said hollow cylindrical transducer pivot screws.

11. A solenoid actuated wire clamping apparatus as set forth in claim 1 wherein said first and said second solenoids are mounted on split blocks which are isolated and mounted on said support arms of said housing.

12. A solenoid actuated wire clamping apparatus as set forth in claim 1 wherein said first and said second solenoids each having a plunger are provided with damper washers on the actuating rods of the solenoid plungers to prevent the solenoid plunger from physically engaging the solenoid housing.

* * * * *